United States Patent
Bayer

Patent Number: 5,329,247
Date of Patent: Jul. 12, 1994

[54] SWITCHABLE MOS CURRENT MIRROR

[75] Inventor: Erich Bayer, Ergolding, Fed. Rep. of Germany

[73] Assignee: Texas Instruments Deutschland GmbH, Fed. Rep. of Germany

[21] Appl. No.: 949

[22] Filed: Jan. 5, 1993

[30] Foreign Application Priority Data

Jan. 17, 1992 [DE] Fed. Rep. of Germany ....... 4201155

[51] Int. Cl.⁵ ............................................. H03F 3/16
[52] U.S. Cl. .................................... 330/288; 323/317
[58] Field of Search ................ 330/288; 323/315, 316, 323/317

[56] References Cited

U.S. PATENT DOCUMENTS 5,204,612 4/1993 Lingstaedt ......................... 323/317

Primary Examiner—James B. Mullins
Attorney, Agent, or Firm—William E. Hiller; Richard L. Donaldson

[57] ABSTRACT

The present invention relates to a switchable MOS current mirror having an input and an output current branch (1, 2), a plurality of first and second MOS-field-effect transistors, and a circuit section containing a third and a fourth MOS field effect transistor (Q3, Q4). The gate electrodes of the first MOS field-effect transistors are connected respectively to a gate electrode of a second MOS field-effect transistor and to the respective drain electrodes of the first MOS field-effect transistors. The gate electrode of the third and the gate electrode of the fourth MOS field-effect transistor are connected to a control terminal (S) and to the operating voltage (Vb) respectively. To ensure as constant an input current as possible in the first current branch and as clean an output current signal (Ia) as possible with a short rise time, according to the invention capacitors (C1, C2) are provided for furnishing charge currents and are connected between ground or the operating voltage terminal and the connection points of the gate electrodes connected to each other in pairs. Consequently, the gate currents necessary for rendering the second circuit conductive are not branched from the input current (Ie) but from the capacitors.

8 Claims, 5 Drawing Sheets

SWITCHABLE MOS CURRENT MIRROR

The present invention relates to a switchable MOS current mirror having an input current branch and an output current branch, a plurality of first and second MOS field-effect transistors, in each case the drain-source paths of the first and second MOS field-effect transistor lying in series connection and each gate electrode of a first MOS field-effect transistor being connected to the drain electrode thereof and to a corresponding gate electrode of a second MOS field-effect transistor, and a circuit section which comprises a third and a fourth MOS field-effect transistor and the gate electrodes of which are connected to the operating voltage and to a control terminal and the drain-source paths of which connect the two current branches together.

In integrated MOS circuits current mirrors are required to drive circuits by means of currents having magnitudes which are exactly defined. FIG. 1 shows a known MOS current mirror comprising a first current branch through which a substantially constant current Ie flows and a second current branch via which an output current Ia is emitted when a control signal is applied to a terminal S of the MOS current mirror. The first and second current branches each comprise three MOS field-effect transistors, Q1 and Q2, Q3 and Q4 and Q5 and Q6 which lie in cascade circuit. The input current Ie is supplied to the MOS field-effect transistor Q1 via the drain electrode thereof whilst the output current Ia is emitted via the drain electrode of the MOS field-effect transistor Q6. The gate electrodes of the MOS field-effect transistors Q1 and Q6 are connected to the drain electrode of the MOS field-effect transistor Q1. The gate electrodes of the MOS field-effect transistors Q2 and Q5 are connected to the source electrode of the transistor Q1 whilst the drain electrodes of the transistors Q2 and Q5 are connected to the source electrodes of the transistors Q1 and Q6 respectively. The gate electrodes of the MOS field-effect transistors Q3 and Q4 are connected to an operating voltage Vb and to the terminal S respectively.

The mode of operation of such a current mirror can be explained with the aid of the time diagrams of FIG. 2. The first time diagram (first diagram) shows the time profile of the input current Ie. If a control signal Us is supplied to the current mirror via the terminal S (see second time diagram), the transistor Q4 of the second current branch opens so that the gate-source voltage at the transistors Q5 and Q6 changes. This results directly in the flowing of charge currents I1 and I2 into the gate capacitances of said two transistors. These charge currents are branched from the input current Ie so that the full input current Ie is no longer available for the mirroring. Thus, during the time of the flowing of the charge currents the output current Ia no longer corresponds to the original input current Ie but is lower by the sum of the charge currents than the desired value Io corresponding to the input current. As a result, a pronounced retardation of the leading edge of the output current Ia occurs. In the fourth diagram of FIG. 2 the time profile of the charge currents is shown. The output current Ia, the time profile of which is shown in the third diagram of FIG. 2, rises gradually until the desired value Io is reached. The output current retains its desired value Io for as long as the control signal is in the H state. As apparent from the second and third time diagrams the output current Ia is switched off as soon as the control signal changes to the L state.

Although this MOS current mirror has a high accuracy in direct current operation this accuracy decreases considerably when the switching frequency corresponding to the control signal frequency increases because due to the charge currents the input current drops below its desired value and because also due to the charge currents the rise time of the output current is considerably increased and consequently the output current Ia no longer reaches the desired value Io at higher switching frequencies within the switching period. In addition, the charge current I1 branched from the input current Ie leads to unclear leading and trailing edges of the output current and at high switching frequencies this has a disturbing effect on the operation of a circuit driven by the current mirror.

The problem underlying the present invention is therefore to provide a switchable MOS current mirror which even at high switching frequencies furnishes an output current which with high accuracy corresponds to the desired value of the input current. This problem is solved in a switchable MOS current mirror of the type outlined at the beginning in that charge storage capacitors (C1, C2) are connected to the respective gate electrodes of the first MOS field-effect transistors.

Subsidiary claims 2 and 3 set forth how the MOS current mirror according to the invention is used to drive a circuit.

In an MOS current mirror according to the invention the charge currents of the gate capacitors of the MOS field-effect transistors of both current branches are furnished by charge storage capacitors and consequently the charge currents are no longer branched from the input current. Consequently, even at high switching frequencies the output current corresponds exactly to the input current.

Hereinafter examples of embodiment of the present invention will be described with the aid of the drawings, wherein:

FIGS. 1 and 2 show the circuit diagram and the time diagrams of the MOS current mirror described in the introduction to the description necessary for the explanation of the mode of operation.

Figure 3:
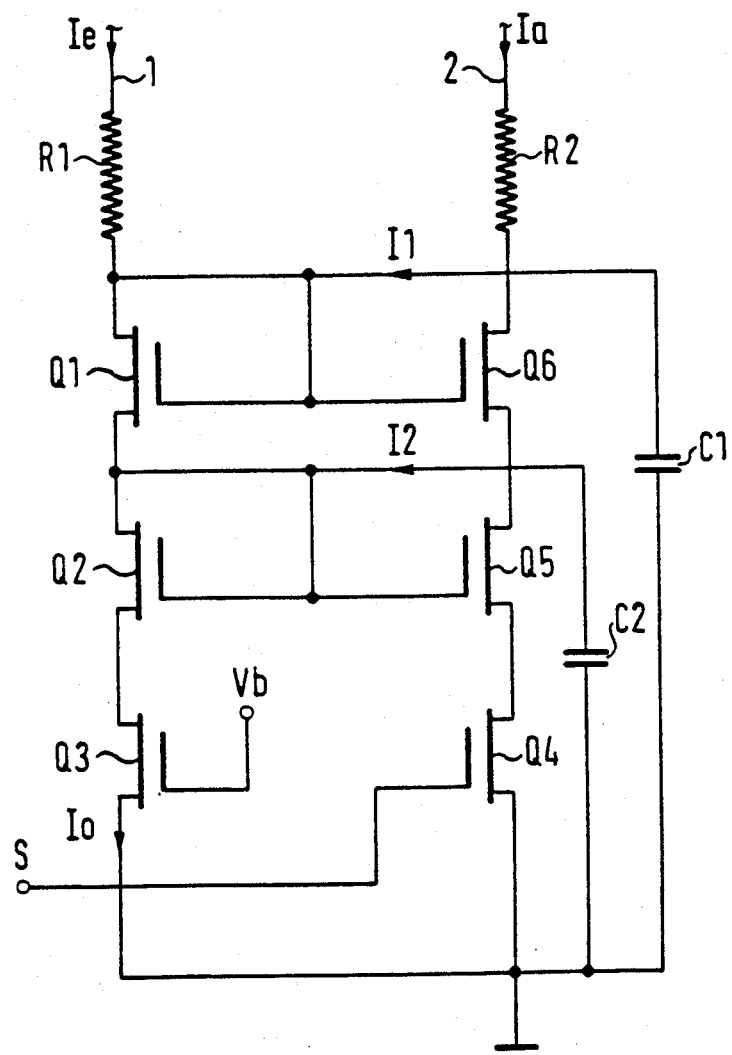
FIG. 3 shows a first example of embodiment of the invention.

The example of embodiment illustrated in FIG. 3 shows a switchable MOS current mirror of an integrated circuit having an input current branch 1 through which an input current Ie flows and which includes a first and second MOS field-effect transistor (Q1, Q2), and an output current branch 2 which includes a fifth and sixth MOS field-effect transistor (Q5, Q6) and via which an output current Ia is emitted when a control signal is applied to a terminal S of the MOS mirror. Both current branches are connected to ground via the drain-source paths of a third and fourth MOS field-effect transistor (Q3, Q4) which are both arranged in a circuit section of the current mirror. The drain-source paths of the input and output current branches (1, 2)

each lie in series connection and are connected in series to a first resistor R1 and to a second resistor R2 respectively. The gate electrodes of the MOS field-effect transistors Q1 and Q6 are connected to the resistor R1 and are connected to the connection point between the first field-effect transistor Q1 and the first resistor R1 and via a first capacitor C1 to ground. The gate electrodes of the MOS field-effect transistors Q2 and Q5 are connected to the source electrode of the first MOS field-effect transistor Q1 and are connected to the connection point between the first and second MOS field-effect transistors (Q1, Q2) and via a second capacitor C2 to ground. The source electrodes of the transistors Q2 and Q5 are connected to the drain electrodes of the third and fourth MOS field-effect transistors (Q3, Q4). The source electrodes of the third and fourth MOS field-effect transistors, Q3 and Q4, are connected to ground whilst the gate electrodes of the third and fourth field-effect transistors, Q3 and Q4 are connected to the operating voltage Vb and to the terminal S respectively, the latter serving to supply a control signal (Us).

Figure 4:
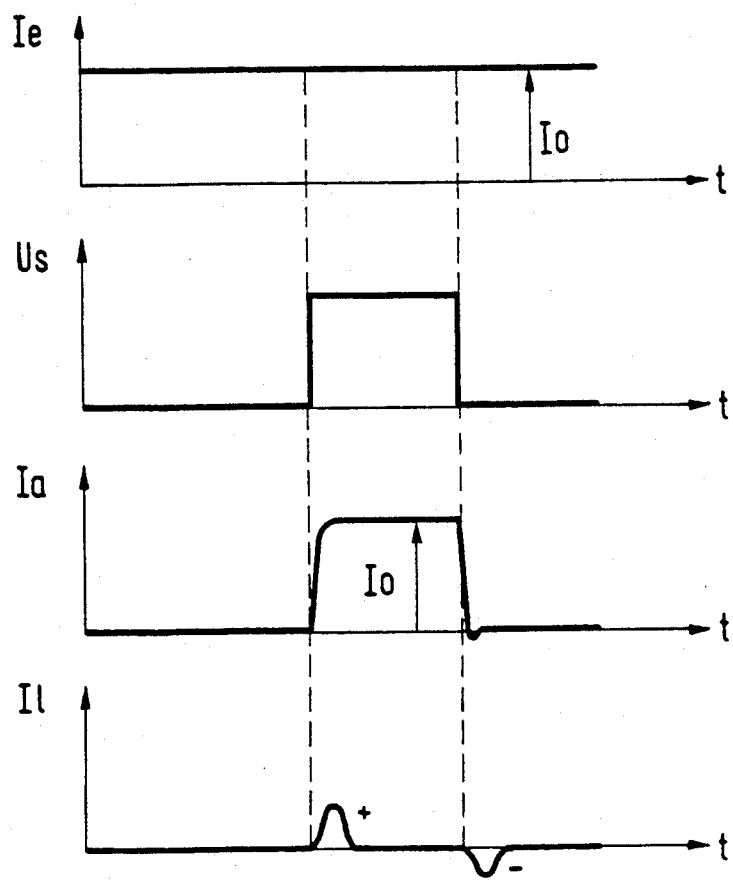
FIG. 4 shows time diagrams to explain the mode of operation of the first example of embodiment.

The mode of operation of the first example of embodiment of the invention will now be described hereinafter with the aid of the time diagrams of FIG. 4.

If the MOS current mirror is connected to a current source, the capacitors C1 and C2 are charged via their connection conductor to the first current branch until the capacitors reach substantially fixed voltage values U1 and U2 respectively. After the charging operation a constant input current Ie then flows through the first current branch.

If the MOS field-effect transistor Q4 is opened on applying a control signal Us (see second diagram of FIG. 4), the capacitors C1 and C2 substantially maintain the voltages U1 and U2 applied to the gate electrodes of the MOS field-effect transistors Q5 and Q6 so that no charge current is branched from the first current branch. The capacitors C1 and C2 act like accumulators and furnish the positive charge currents I1 and I2 necessary for opening the field-effect transistors Q5 and Q6. As a result, the input current Ie does not drop below a predetermined desired value Io when a positive charge current I1 equal to I1+I2 flows after reception of the control signal (see first and fourth time diagram of FIG. 4). Consequently, during the charge operation as well the relationship Ie=Io still applies.

When the MOS field-effect transistor Q4 becomes nonconductive after removal of the voltage signal, the charge disposed in the gate electrodes of the field-effect transistors Q5 and Q6 can flow away again, a negative charge current I1 thereby flowing into the capacitors C1 and C2. If no charge current is to be branched from the input current Ie the capacitances (C) of the capacitors C1 and C2 must firstly be large enough to ensure that substantially no voltage changes occur at the capacitors and thus at the gate electrodes during the charging operation. The voltage change ΔU at the gate electrodes of the MOS field-effect transistors Q5 and Q6 may be quantitatively defined by the following formula:

$$\Delta U = \int I_g \, dt / C$$

Ig therein is the current flowing from or to the gate electrode and C the capacitance of the capacitors C1 or C2. In most uses, capacitances of a few pF are sufficient. On the other hand, the capacitance C of the capacitors C1 and C2 must not exceed a predetermined upper limit which depends on the duration of the off times $t_{OFF}$. If the off times (time for which the control signal Us is in the L state) are short and the capacitance C large, the capacitors C1 and C2 cannot be charged up to their original values during the off times. The charge time $t_L$ necessary for the charging of the capacitors C1 and C2 may be quantitatively defined by the following formula:

$$t_L = C \cdot \Delta U \, / \, I_e$$

Consequently, the shortest off time must be longer than the charge time $t_L$, i.e. the following condition must be fulfilled: $t_{OFF} > C \cdot \Delta U \, / \, I_e$.

Figure 1:
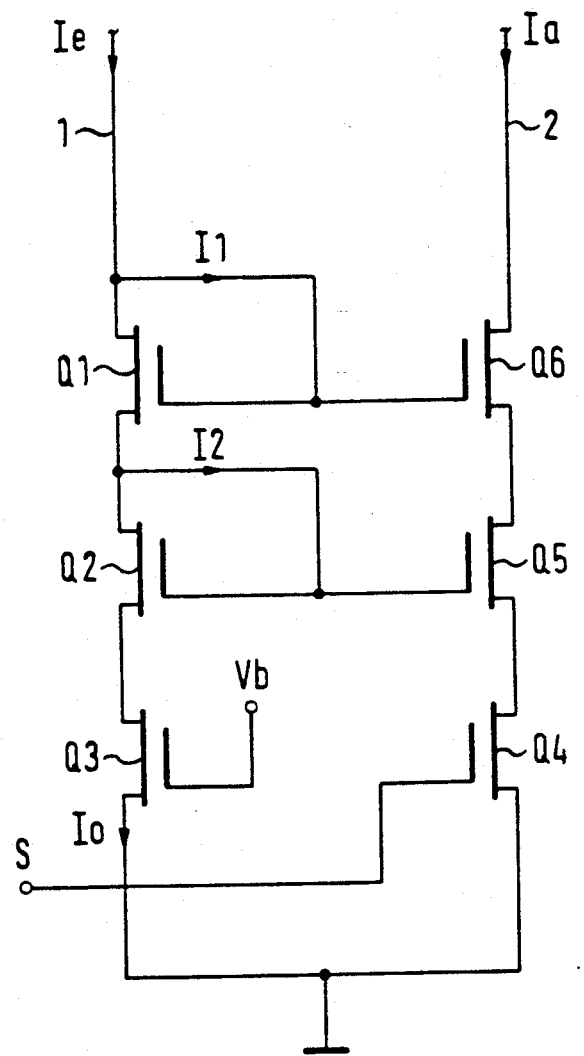
FIG. 1 shows the circuit diagram of a conventional MOS current mirror.
Figure 2:
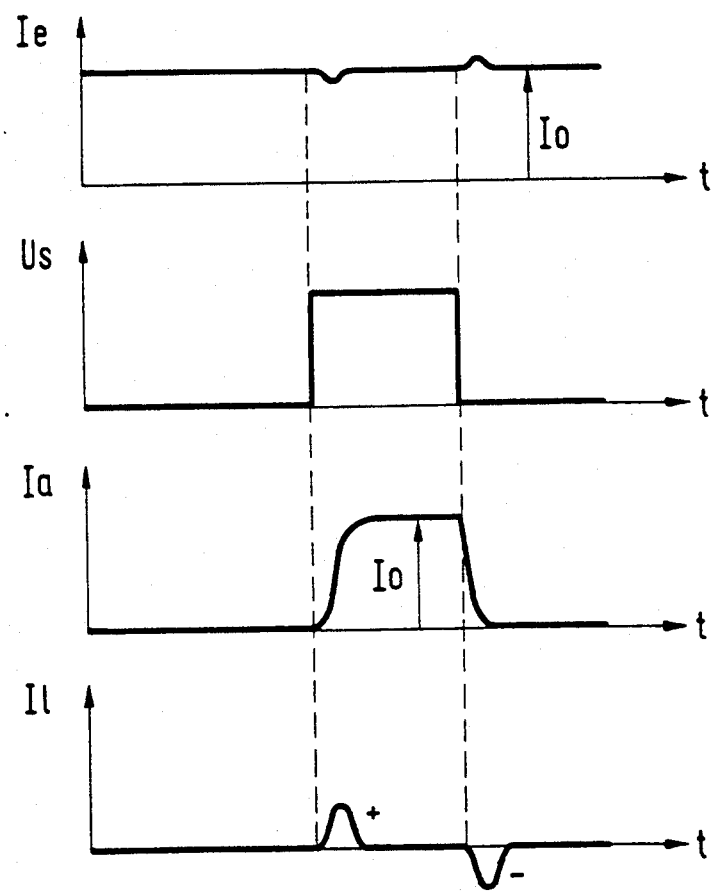
FIG. 2 shows the time diagrams to explain the mode of operation of the MOS current mirror of FIG. 1.

The MOS current mirror of FIG. 3 has a number of advantages compared with conventional current mirrors: As FIG. 4 shows, not only positive but also negative charge currents may be furnished via the capacitors C1 and C2; the capacitors C1 and C2 furnish the necessary charge currents without the transit time of the MOS current mirror being lengthened; as apparent from the comparison of the corresponding time diagrams of FIG. 2 and FIG. 4, the rise time of the output current Ia is shortened compared with conventional MOS current mirrors, thereby ensuring a shorter switching time.

Figure 5:
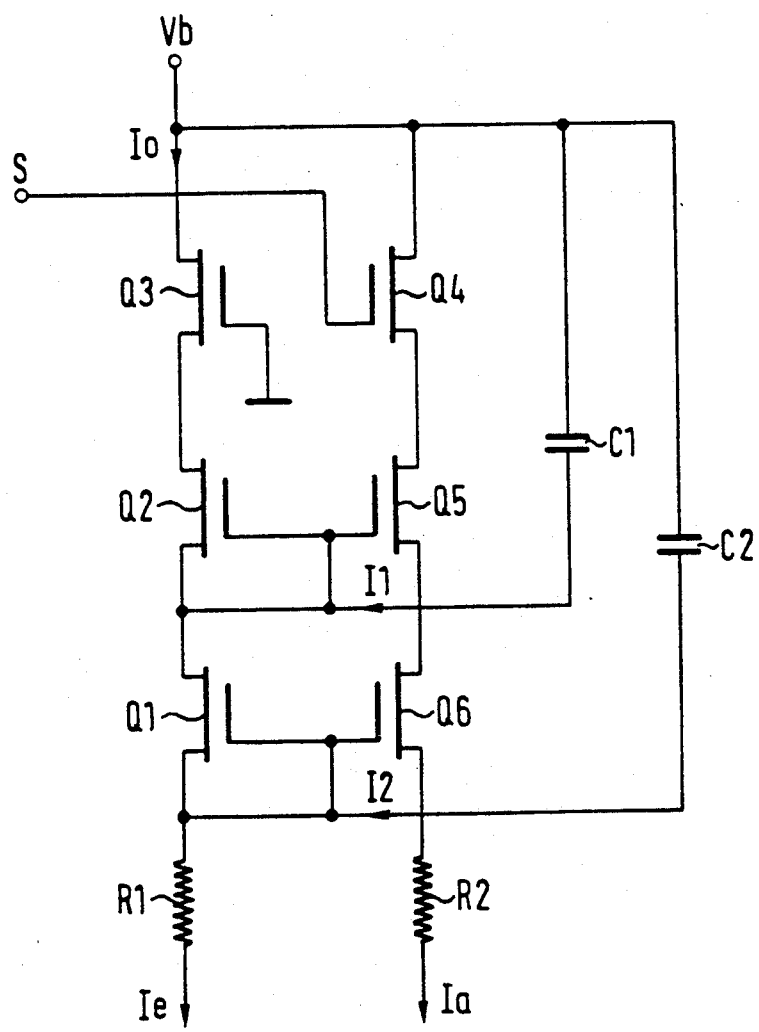
FIG. 5 shows a second example of embodiment of the present invention.

The example of embodiment described in FIG. 5 shows a switchable MOS current mirror having input and output current branches including P-channel MOS field-effect transistors. The mode of operation of the second example of embodiment is the same as that of the MOS current mirror described with the aid of FIG. 4. The example of embodiment illustrated in FIG. 5 shows that the present invention is suitable not only for integrated circuits with N-channel field-effect transistors but also for integrated circuits with P-channel field-effect transistors.

I claim:

1. A switchable current mirror circuit comprising:
   an input current branch;
   an output current branch arranged in parallel relation to said input current branch;
   a plurality of first field-effect transistors disposed in said input current branch;
   a plurality of second field-effect transistors disposed in said output current branch;
   each of said field-effect transistors including spaced drain and source electrodes defining a drain-source path and a gate electrode overlying the drain and source electrodes;
   the drain-source paths of the first field-effect transistors disposed in said input current branch being connected in series;
   the drain-source paths of the second field-effect transistors disposed in said input current branch being connected in series;
   each of the gate electrodes of said first field-effect transistors being connected to a drain electrode thereof and to a corresponding gate electrode of a respective second field-effect transistors;
   a circuit section including
      a third and a fourth field-effect transistor, each of said third and said fourth field-effect transistors having spaced drain and source electrodes defining a drain-source path and a gate electrode overlying the drain and source electrodes;
      an operating voltage terminal,
      a control terminal, one of said source electrode and said gate electrode of said third field-effect transistor being connected to said operating voltage terminal, and
the gate electrode of said fourth field-effect transistor being connected to said control terminal,
the drain-source paths of said third and fourth field-effect transistors being connected to each other and connecting the input current branch and the output current branch together; and
a plurality of charge storage capacitors corresponding in number to the plurality of first field-effect transistors, each of said capacitors being respectively connected to the gate electrode of the first field-effect transistor corresponding thereto.

2. A switchable current mirror circuit as set forth in claim 1, wherein said gate electrode of said third field-effect transistor is connected to said operating voltage terminal.

3. A switchable current mirror circuit as set forth in claim 1, wherein said source electrode of said third field-effect transistor is connected to said operating voltage terminal.

4. A switchable current mirror circuit as set forth in claim 1, further including a first resistor in said input current branch and being connected in series with the drain-source paths of said first field-effect transistors and through which a constant input current is adapted to flow; and
a second resistor in said output current branch and being connected in series with the drain-source paths of said second field-effect transistors and through which an output current is adapted to flow in response to a control signal applied to the control terminal.

5. A switchable current mirror circuit as set forth in claim 4, wherein said gate electrode of said third field-effect transistor is connected to said operating voltage terminal.

6. A switchable current mirror circuit as set forth in claim 5, wherein the second resistor is in the form of a circuit to be driven via the output current.

7. A switchable current mirror circuit as set forth in claim 4, wherein said source electrode of said third field-effect transistor is connected to said operating voltage terminal.

8. A switchable current mirror circuit as set forth in claim 7, wherein the second resistor is in the form of a circuit to be driven via the output current.

* * * * *